US009331711B2

(12) United States Patent
Hammel et al.

(10) Patent No.: US 9,331,711 B2
(45) Date of Patent: May 3, 2016

(54) METHOD FOR PROCESSING A MEASURED-VALUE SIGNAL DETERMINED IN AN ANALOG MANNER, A RESOLVER SYSTEM FOR IMPLEMENTING THE METHOD AND A METHOD FOR DETERMINING AN OUTPUT CURRENT OF A CONVERTER

(75) Inventors: Wolfgang Hammel, Bruchsal (DE); Ulrich Neumayer, Forst (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 978 days.

(21) Appl. No.: 13/392,422

(22) PCT Filed: Aug. 12, 2010

(86) PCT No.: PCT/EP2010/004926
§ 371 (c)(1),
(2), (4) Date: Feb. 24, 2012

(87) PCT Pub. No.: WO2011/023299
PCT Pub. Date: Mar. 3, 2011

(65) Prior Publication Data
US 2012/0166118 A1 Jun. 28, 2012

(30) Foreign Application Priority Data

Aug. 26, 2009 (DE) .......................... 10 2009 038 594
Jul. 16, 2010 (DE) .......................... 10 2010 027 471

(51) Int. Cl.
*G01R 19/00* (2006.01)
*H03M 3/00* (2006.01)
(Continued)

(52) U.S. Cl.
CPC .............. *H03M 3/462* (2013.01); *H03M 1/645* (2013.01); *H03M 1/66* (2013.01); *H03M 1/661* (2013.01)

(58) Field of Classification Search
CPC ........ H03M 1/645; H03M 1/66; H03M 1/661
USPC ......................................................... 702/64
See application file for complete search history.

(56) References Cited

U.S. PATENT DOCUMENTS 4,872,129 A * 10/1989 Pfeifer et al. ................. 708/313
5,249,578 A * 10/1993 Karp et al. .................... 600/447
(Continued)

FOREIGN PATENT DOCUMENTS

DE 10 2005 005 024 8/2006
EP 0 320 517 6/1989
EP 1 441 440 7/2004

OTHER PUBLICATIONS

International Preliminary Report on Patentability, issued in corresponding International Application No. PCT/EP2010/004926.
(Continued)

*Primary Examiner* — John Breene
*Assistant Examiner* — Eyob Hagos
(74) *Attorney, Agent, or Firm* — Kenyon & Kenyon LLP

(57) ABSTRACT

In method for processing a measured-value signal determined in an analog manner and a resolver system for implementing the method, the measured-value signal being supplied to a delta-sigma modulator, which makes a bit stream, particularly a one-bit data stream, available on the output side, in particular, whose moving average corresponds to the measured-value signal, the bit stream being supplied to a first digital filter, which converts the bit stream into a stream of digital intermediate words, that is a multibit data stream, the first digital filter having three serially arranged differentiators, the bit stream being clocked at a clock frequency $f_S$, that is, at a clock-pulse period $T_S=1/f_S$, and therefore the stream of digital intermediate words being clocked, and thus updated, at a clock-pulse frequency $f_D$, that is, at a clock-pulse period $T_D=1/f_D$, the output signal of the first digital filter being supplied to a second digital filter, the second digital filter having as its output data-word stream the difference between a first and a second result data-word stream, the first and second result data-word stream being determined around a first and second time interval from the intermediate data-word stream, the first and second time interval being situated at a distance in time T1, the first result data-word stream being determined as a time-discrete second derivation with time scale TD and the second result data-word stream being determined as a time-discrete second derivation with time scale TD.

18 Claims, 2 Drawing Sheets

Figure 1:
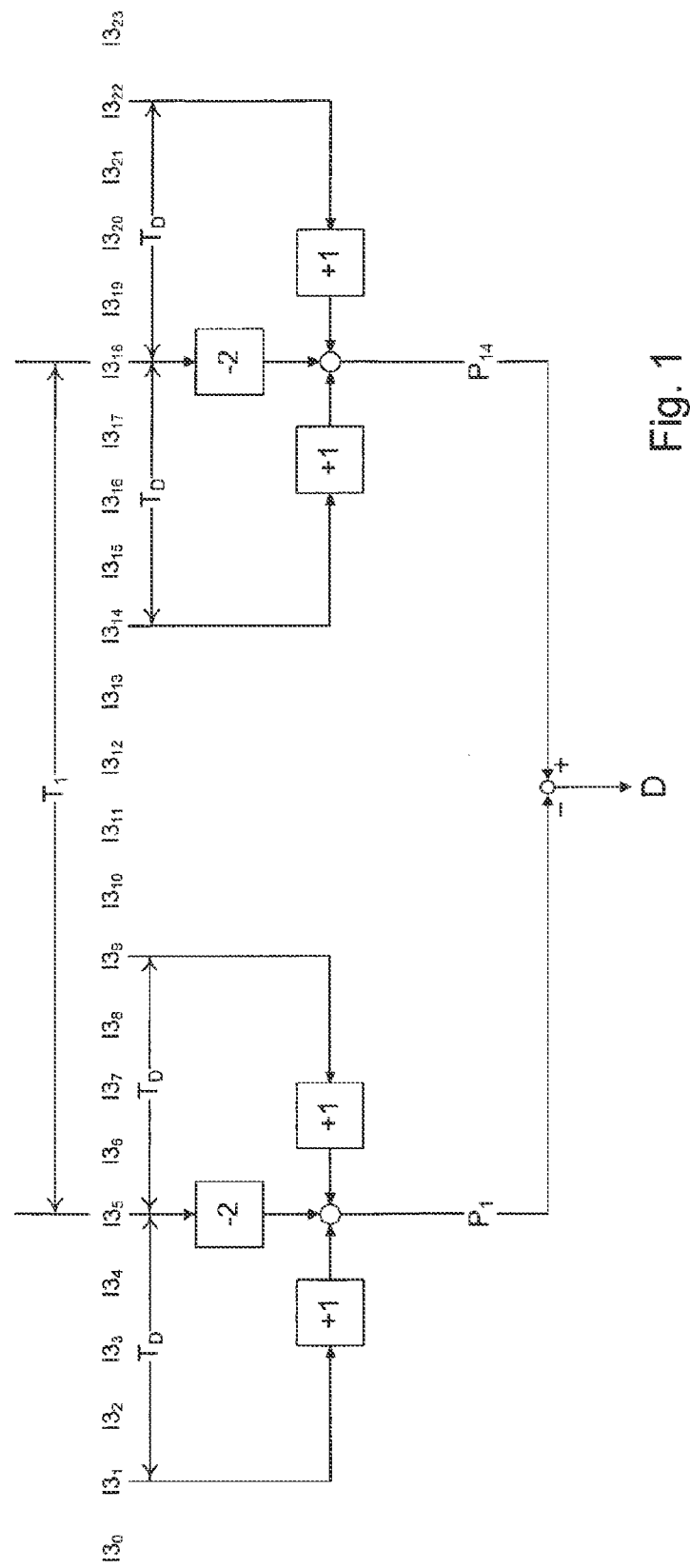

(51) Int. Cl.
*H03M 1/64* (2006.01)
*H03M 1/66* (2006.01)

(56) References Cited

U.S. PATENT DOCUMENTS 5,373,460 A * 12/1994 Marks, II ..................... 708/300
7,196,643 B2   3/2007 Ohnhaeuser et al.
7,330,865 B2   2/2008 Koyanagi
2006/0170579 A1 * 8/2006 Ohnhaeuser et al. ......... 341/143

OTHER PUBLICATIONS

International Search Report, issued in corresponding International Application No. PCT/EP2010/004926.
European Office Action, dated Mar. 5, 2013, issued in corresponding European Patent Application No. 10745165.0.

* cited by examiner

METHOD FOR PROCESSING A MEASURED-VALUE SIGNAL DETERMINED IN AN ANALOG MANNER, A RESOLVER SYSTEM FOR IMPLEMENTING THE METHOD AND A METHOD FOR DETERMINING AN OUTPUT CURRENT OF A CONVERTER

FIELD OF THE INVENTION

The present invention relates to a method for processing a measured-value signal determined in an analog manner, a resolver system for implementing the method and a method for determining an output current of a converter.

BACKGROUND INFORMATION

DE 10 2005 005 024 describes a method, in which the analog carrier voltage signal values generated by a resolver used as an angular-position sensor, the curve of which is essentially sinusoidal and the amplitude of which corresponds to the sine value or the cosine value of the angular value to be detected, are converted into a digital data stream. A delta-sigma modulator is used for this analog-digital conversion, which has a $Sinc^3$ filter connected in outgoing circuit, which acts as a low-pass filter. For the three accumulators, acting in an integrating fashion, of FIG. 5 of that document are operated at a faster clock-pulse frequency $F_S$ than the three differentiators operated at the slower clock-pulse frequency $F_D$. At the filter, a multi-bit data stream exits on the output side, which, according to FIG. 2 in the above document, is supplied to a decimating filter OSR2, which essentially corresponds to a summation, that is, an averaging. At its output, the measured value is thus provided in digital form.

A synchronization of the multi-bit data stream to other signal curves is possible only with difficulty or not at all. The measuring duration or the beginning and end of the measuring interval is settable only at a long time duration $T_D$, since the signal at the output of the third integrator is subsampled at $f_D$. From this point on, all signals in the signal chain are thus only available at the rough time quantization $T_D$. The determination of the beginning and end or of the measuring duration, over which decimation filter OSR2 measures, may therefore occur only in integral multiples of $T_D$. In industrial applications, however, it is frequently necessary to synchronize secondary control loops to primary control loops. These different control loops may also be implemented in a spatially separated fashion, the time referencing then being transmitted via a field bus system. The task is then to synchronize the secondary control loop to a clock pulse specified from outside. For this purpose, the period duration of the sampling interval of the secondary control loops is normally modified slightly in order to achieve this synchronization. In order to be able to perform this synchronization at a high quality, it is necessary to be able to modify the period duration of the secondary control loop in increments that are as small as possible. A rough time quantization of the smallest possible period duration modification thus limits the achievable quality of the synchronization control. Since within a control loop the measured-value detection is also operated in a synchronized fashion, a rough quantization of the measuring times or the measuring duration likewise results in a limitation in the synchronization control.

SUMMARY

Example embodiments of the present invention provide a measuring method, in which the beginning and end of the measuring interval or of the measuring duration may be defined at a high time resolution. In the method described herein, this time quantization is $T_S$, which in DE 10 2005 005 024 is $T_D$. In order to achieve a sufficient filter effect of the low-pass filter, however, $T_D$ must be selected to be substantially greater than $T_S$, which results in the mentioned limitations in the described related art.

EP 0 320 517 describes a digital decimation filter, in which a final differentiator k has delay elements that delay by the period duration of the output data clock pulse, that is, decimation clock pulse dt. Thus only integral multiples of the decimation clock pulse dt are implementable as a delay. To be sure, the last of the integrators in FIG. 1 of EP 0 320 517, according to claim 1 thereof, is equipped with a reset device, which thus acts like a differentiator (EP 0 320 517, claim 1, line 56).

Example embodiments of the present invention provide for analog-digital conversion in a measured value detection further. Thus, it is possible to determine the beginning and the end of the measuring interval at a high resolution in time.

Among features of example embodiments of the present invention in the method are that it is provided for processing a measured-value signal determined in an analog manner, the measured-value signal being supplied to a delta-sigma modulator, which provides a bit stream, in particular a one-bit data stream, on the output side, the bit stream being supplied to a first digital filter, which converts the bit stream into a stream of digital intermediate words, that is, a multi-bit data stream, the first digital filter having a number n of serially arranged accumulators, in particular integrators, n being a whole number and equal to or greater than 1 or 2, the bit stream being clocked at a clock-pulse frequency fS, that is, at a clock-pulse period TS=1/FS, and thus the stream of digital intermediate words being clocked and thus updated at a clock-pulse frequency fS, that is, the clock-pulse period TS=1/fS, the output signal of the first digital filter being supplied to a second digital filter, the second digital filter having as its output data-word stream the difference between a first and a second result data-word stream, the first and second result data-word stream being determined over a first and second time interval from the intermediate data-word stream, the first and second time interval being situated at a distance in time T1, the first result data-word stream being determined from the intermediate data-word stream as a time-discrete differential of the (n−1)th order at time scale TD, and the second result data-word stream being determined from the intermediate data word stream as a time-discrete differential of the (n−1)th order at time scale TD, distance in time T1 being greater than time scale $T_D$, in particular T1 being an integral multiple of clock-pulse period $T_S$.

Signal clock-pulse $T_U$ at the output of the second digital filter may be selected differently depending on the exemplary application and exemplary embodiment of the method. For example, T1, $T_D$ or even $T_S$ or any other integral multiple of $T_S$ may be utilized as signal clock-pulse $T_U$. It is advantageous in this regard that $T_U$ may be selected as a multiple of TS and hence may be set at a high resolution in time.

For example, the method may be used to detect the output current "i" of a converter that is operated in a pulse-width modulated manner. For this purpose, the measuring duration T1 should extend over a half PWM period duration for example. Consequently, T1 may be set very precisely at the high time resolution of $T_S$ in accordance with the desired measuring duration. Furthermore, a measurement should occur in each PWM period, and thus $T_U$ is defined independently of T1 in accordance with PWM period duration $T_{PWM}$. This may likewise occur at the high time resolution of $T_S$. Even if e.g. $T_{PWM}$ is not an integral multiple of $T_S$, the time deviation from it when defining $T_U$ remains very low when using the method according to the present invention.

The advantage in this context is that an improved analog-to-digital conversion is practicable, in which a digital filter is now usable that, on one hand, has a low-pass function, and on the other hand, makes the data stream available in such a way that the digital information with regard to the signal-voltage value at the input of the delta-sigma modulator is available with very high accuracy. It is especially advantageous that the series arrangement of accumulators is not followed by any differentiators with subsequent averaging, but rather that only a few intermediate data words are linked, in each case at a suitable distance in time, with the aid of simple operations such as subtraction and addition or multiplication by the factor 2, or the like. Thus, a highly precise analog-to-digital conversion is feasible with little effort. In addition, even in the case of a realization in hardware, a change of distances in time $T_D$ is practicable without special effort.

Another advantage is that no reset devices have to be used in the case of the accumulators, and therefore unadulterated results are attainable.

Among features in the case of the method are that it is provided to process a measured-value signal determined in an analog manner, the measured-value signal being supplied to a delta-sigma modulator, which makes a bit stream, particularly a one-bit data stream, available on the output side, in particular, whose average value or a moving average corresponds to the measured-value signal, the bit stream being supplied to a first digital filter that converts the bit stream into a stream of digital intermediate words, that is, a multi-bit data stream, the first digital filter having a number n of serially arranged accumulators, in particular integrators, n being a whole number and equal to or greater than 1 or 2, the bit stream being clocked at a clock-pulse frequency $f_S$, that is, at a clock-pulse period $T_S=1/f_S$, and therefore the stream of digital intermediate words being clocked, and thus updated, at clock-pulse frequency $f_S$, that is, clock-pulse period $T_S=1/f_S$, the output signal of the first digital filter being supplied to a second digital filter, the second digital filter having as its output data-word stream the difference between a first and a second result data-word stream, the first and second result data-word streams being determined from the intermediate data-word stream over a first and second time interval, the first and second time intervals being situated at a distance in time T1, the first result data-word stream being determined from the double of the intermediate data word belonging to the first instant, the intermediate data word located at the distance in time $T_D$ prior to the first instant and the intermediate data word located at the distance in time $T_D$ after the first instant being subtracted, the second result data-word stream being determined from the double of the intermediate data word belonging to the second instant, the intermediate data word located at the distance in time $T_D$ prior to the second instant and the intermediate data word located at the distance in time $T_D$ after the second instant being subtracted.

The advantage here is that three accumulators with downstream second differential are already sufficient to achieve a high-quality digital signal.

Example embodiments of the present invention provide the further advantage that the calculation steps for determining the output data-word stream of the second digital filter, that is, the formation of the difference between a first and a second result data-word stream, are executable in overlapping fashion. Thus, the data rate on the output side may be further increased by parallel calculations overlapping in time, that is, by forming such differences.

In example embodiments, T1 is greater than or equal to the double of $T_D$. This offers the advantage that a low-pass filtering is attainable.

In example embodiments, clock-pulse period duration $T_D$ is an integral multiple of $T_S$. The advantage in this case is that a realization in hardware is easily practicable.

In example embodiments, the first digital filter is made up of three integrators or accumulators disposed directly one after the other. The advantage here is that a simple digital low-pass filtering is able to be produced.

In example embodiments, the moving average of the bit stream corresponds to the measured-value signal. Thus, the measured value is able to be represented with high accuracy if a large time interval is taken as a basis for the moving average.

In example embodiments, the clock-pulse signal used in the delta-sigma modulator is applied to the clock-pulse input of the first digital filter. This offers the advantage that a simple implementation is feasible.

In example embodiments, the carrier signal generator produces a pulse-width-modulated signal, which is supplied to the rotor coil and represents essentially a sine signal. This has the advantage that the angular position of the rotor coil is detectable.

Among features in the resolver system are that the resolver system is provided for detecting the angular position of a rotor in relation to a stator, the rotor bearing a rotor coil and the stator having two stator coils that are mutually shifted in the circumferential direction by 90°, the rotor coil having a carrier signal produced by a carrier-signal generator applied to it, each signal occurring at the respective stator coil being supplied as a respective measured-value signal to a respective processing channel, within which an aforementioned method is implemented.

It is advantageous in this regard that the angular position of the rotor in relation to the stator may be provided in digital form at a high accuracy and a fast clock-pulse rate, in particular for a control electronics or as a safety-related state variable.

Among features with respect to the method for determining an output current of a converter are that the measuring signals, detected by a sensor and corresponding to the output current, are supplied to a respective processing channel, within which a method described above is carried out. Advantageously, improved current sensing is thus practicable in the case of converters, as well.

Example embodiments of the present invention are explained in greater detail below with reference to the appended Figures.

DETAILED DESCRIPTION

For this purpose, the analog-digital conversion according to example embodiments of the present invention is described for a resolver evaluation corresponding to 10 2005 005 024 B4. However, it is also applicable analogously to other measured-value detections.

As in FIG. 1 of DE 10 2005 005 024, stator coils mutually shifted in the circumferential direction by 90° are situated for detecting the angular position of the rotor shaft in relation to a stator. The rotor coil has a carrier signal applied to it that runs preferably in a sinusoidal manner and has a period duration $T_C$.

A sine signal is thus induced on the first stator coil and a cosine signal is induced on the second stator coil, which are supplied to a respective processing channel.

Each processing channel comprises a delta-sigma modulator having an output that supplies a bit stream, that is, a one-bit data stream.

This one-bit data stream has the information about the measured value of the supplied signal as time average.

FIG. 1 shows a portion of a filter according to an example embodiment of the present invention, downstream of the delta-sigma modulator, for one respective processing channel.

As in the case of DE 10 2005 005 024, three integrators, which may also be called accumulators or integrating elements and are not shown in FIG. 1, and which are also included by the filter and are operated at a clock-pulse frequency $f_S$, that is, clock-pulse period $T_S = 1/f_S$, are disposed serially one after the other, so that an intermediate data-word stream is output at this serial configuration. In contrast to DE 10 2005 005 024, in which the intermediate data-word stream is supplied to the three following, again serially disposed differentiators, which, however, are operated at the much slower clock-pulse frequency $f_D$, that is, clock-pulse period $T_D = 1/f_D$, a special data-processing method is carried out in example embodiments of the present invention.

This special data processing is illustrated in FIG. 1.

For this purpose, it is important that the intermediate data-word stream be updated in the clock pulse of clock-pulse period $T_S$, that is, in the sampling clock pulse of the delta-sigma modulator.

From this intermediate data stream, a 2nd time-discrete differential, that is, a time-discrete differential of the second order, is determined by adding a first intermediate data word at a first instant to an intermediate data word at a distance $2 \times T_D$ away in time, and from the sum thus formed, subtracting the double value of the intermediate data word lying centrally in time between these two intermediate data words. Thus, a first result value is formed.

In order to form a second result value, the same operation is performed at a time interval lying at the distance in time $T_1$ from the first intermediate data word indicated. Thus, an intermediate data word at that place has again added to it an intermediate data word at a distance $2 \times T_D$ away in time, and from the sum thus formed, the double value of the intermediate data word lying centrally between these two intermediate data words is subtracted, the centrally lying intermediate data word having the distance in time $T_1$ to the centrally lying intermediate data word utilized for calculating the first result value. Thus, a second result value is formed.

Difference D between the two result values is made available on the output side and represents the filtered measured value in digital form, a high accuracy being achievable in the process.

In contrast to DE 10 2005 005 024, neither any differentiators nor an output-side decimation filter OSR2 are necessary, since according to example embodiments of the present invention, the result on the output side is determined directly by the difference between the first and second result.

A special advantage of example embodiments of the present invention is also that T1 is an arbitrary integral multiple of $T_S$, no further specification having to be made. Naturally, in this context, T1 is advantageously greater than the double of $T_D$, that is, $T1 > T_D$. Since, for example, $1/T_S$ amounts to several MHz, thus, for instance, more than 10 MHz, T1 is alterable in fine steps.

Consequently—in particular in operation—T1 is alterable at a high time resolution, and synchronizations to different clocked signal streams are therefore practicable without special effort. If, for example, the measured value of the signals of a resolver processed according to example embodiments of the present invention is supplied to control electronics of a converter, it is therefore possible in easy manner to carry out a synchronization to a clock pulse predefined by a field bus connected to the converter. To that end, only the value of T1 must thus be changed, which is practicable with the high time resolution of $T_S$.

In further exemplary embodiments of the present invention, instead of the second time-discrete differential, a first, third or higher differential, that is, a time-discrete differential of the first, third or higher order is used, if the number of integrators, that is, accumulators, is changed correspondingly. Thus, if n integrators are provided, in order to form the first and second result value, in each case an n-tuple of intermediate data words $f_k$ set apart from one another at regular intervals at distance in time $T_D$ is used, where k runs from 0 to n−1. In this context, the differential is formed by forming the sum of $$(-1)^k \binom{n-1}{k} f_k,$$

k running from 0 to n−1.

Figure 2:
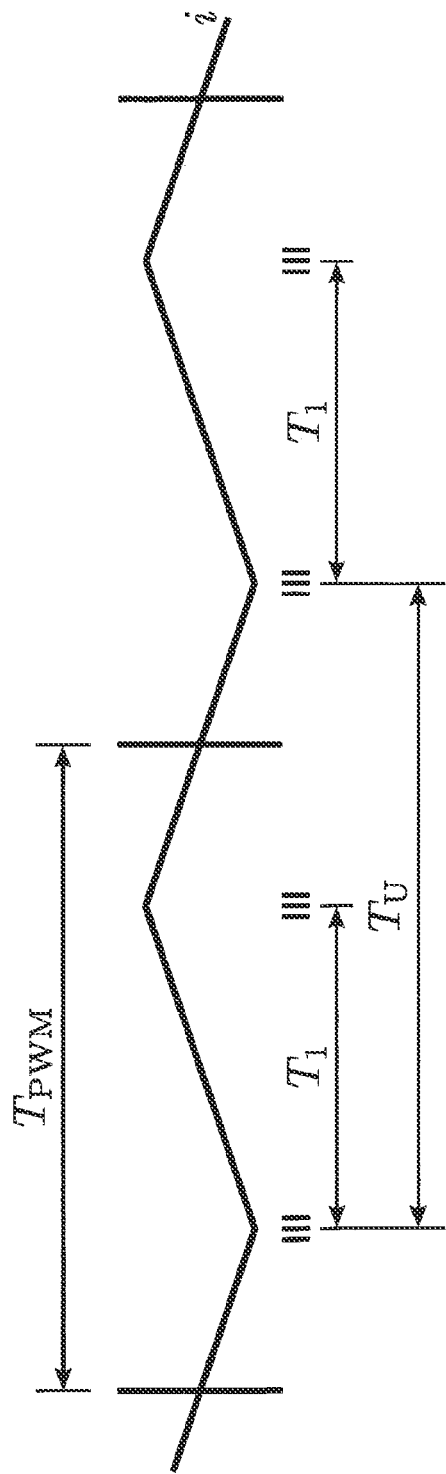

FIG. 2 shows, by way of example, an example embodiment, in which the method is used to detect the output current "i" of a converter, which is operated in a pulse-width modulated manner. For this purpose, the measuring duration T1 should extend over half a PWM period duration for example. Consequently, T1 may be set very precisely at the high time resolution of $T_S$ in accordance with the desired measuring duration.

In FIG. 2, the instants that are used for determining the differentials of the second order are in each case represented by a set of three small bars. Each set of three has a time length of $2 \times T_D$. However, since $T_D$ is very much greater than $T_S$, a representation of distance in time $T_S$ is no longer possible in FIG. 2.

In addition, one measurement is to be performed in each PWM period. Consequently, $T_U$ is specified according to PWM period duration $T_{PWM}$, independently of T1. This may likewise occur at the high time resolution of T. Even if e.g. $T_{PWM}$ is not an integral multiple of $T_S$, the time deviation from it when defining $T_U$ remains very low when using the method described herein.

LIST OF REFERENCE NUMERALS $T_S = 1/f_S$ clock-pulse period
$T_D = 1/f_D$ clock-pulse period
T1 Distance in time

What is claimed is:
1. A method for processing a measured-value signal detected by a sensor and determined in an analog manner, comprising:
supplying the measured-value signal to a delta-sigma modulator, which makes a bit stream available on an output side;

supplying the bit stream to a first digital filter, the first digital filter having a number n of serially arranged accumulators, n being a whole number and equal to at least 1;

converting the bit stream, by the first digital filter, into an intermediate data-word stream of digital intermediate words, the bit stream being clocked at a clock-pulse frequency fS and a clock-pulse period TS=1/fS, and the stream of digital intermediate words being clocked and updated at a clock-pulse frequency fS and a clock-pulse period TS=1/fS;

supplying an output signal of first digital filter to a second digital filter, the second digital filter having a difference between a first and a second result data-word stream as an output data-word stream, the first and second result data-word stream being determined over a first and second time interval from the intermediate data-word stream, the first and second time interval being situated at a distance in time T1 the first result data-word stream being determined from the intermediate data-word stream as a time-discrete differential of the (n−1)th order at time scale TD, and the second result data-word stream being determined from the intermediate data-word stream as a time discrete differential of the (n−1)th order at time scale TD, the distance in time T1 being alterable to at one of (a) being greater than the time scale TD, (b) being an integral multiple of clock-pulse period TS, and (c) not being an integral multiple of time scale TD.

2. The method according to claim 1, wherein the bit stream includes a one-bit data stream.

3. The method according to claim 1, wherein the stream of digital intermediate words is a multi-bit data stream.

4. The method according to claim 1, therein the serially arranged accumulators include integrators.

5. A method for processing a measured-value signal detected by a sensor and determined in an analog manner, comprising:

supplying the measured-value signal to a delta-sigma modulator, which makes a bit stream available on an output side, at least one of (a) an average value and (b) a moving average corresponding to the measured-value signal;

supplying the bit stream to a first digital filter that converts the bit stream into an intermediate data-word stream of digital intermediate words, the first digital filter having a number n of serially disposed accumulators, where n is an integer and is equal to at least 1, the bit streams being clocked at a clock-pluse frequency fS and a clock-pulse period TS=1/fS, and the stream of digital intermediate words being clocked and updated at a clock-pulse frequency fS and clock-pulse period TS=1/fS;

supplying an output signal of the first digital filter to a second digital filter, the second digital filter producing a difference between a first and a second result data-word stream as an output data-word stream, the first and second result data-word streams being determined from the intermediate data-word stream over a first and second time interval, the first and second time intervals being situated at a distance in time T1, the the first result data-word stream being determined from a double of the intermediate data word belonging to the first instant, the intermediate data word located at the distance in time TD prior to the first instant and the intermediate data word located at the distance in time TD after the first instant being subtracted, the second result data-word stream being determined from a double of the intermediate data word belonging to the second instant, the intermediate data word located at the distance in time TD prior to the second instant and the intermediate data word located at the distance in time TD after the second instant being subtracted, the distance in time T1 being alterable to at least one of (a) being greater than the time scale TD, (b) being an integral multiple of clock-pulse period TS, and (c) not being an integral multiple of time scale TD.

6. The method according to claim 5, wherein the bit stream includes a one-bit data stream.

7. The method according to claim 5, wherein the stream of digital intermediate words is a multi-bit data stream.

8. The method according to claim 5, wherein the serially arranged accumulators include integrators.

9. The method according to claim 5, wherein T1 is greater than or equal to a double of TD.

10. The method according to claim 5, wherein the clock-pulse period duration TD is an integral multiple of TS.

11. The method according to claim 5, wherein the first digital filter includes three integrators or accumulators disposed directly one after another.

12. The method according to claim 5, wherein the moving average of the bit stream corresponds to the measured-value signal.

13. The method according to claim 5, wherein the clock-pulse signal used in the delta-sigma modulator is applied to the clock-pulse input of the first digital filter.

14. The method according to claim 5, wherein a carrier signal generator produces a pulse-width-modulated signal, which is supplied to a rotor coil and substantially represents a sine signal.

15. A resolver system adapted to detect an angular position of a rotor in relation to a stator, the rotor bearing a rotor coil and the stator having two stator coils that are mutually shifted in a circumferential direction by 90°, the rotor coil having a carrier signal produced by a carrier signal generator applied to it, wherein each signal occurring at a respective stator coil is supplied as a respective measured-value signal to a respective processing channel, within which a method as recited in claim 1 is implemented.

16. A resolver system adapted to detect an angular position of a rotor in relation to a stator, the rotor bearing a rotor coil and the stator having two stator coils that are mutually shifted in a circumferential direction by 90°, the rotor coil having a carrier signal produced by a carrier signal generator applied to it, wherein each signal occurring at a respective stator coil is supplied as a respective measured-value signal to a respective processing channel, within which a method as recited in claim 5 is implemented.

17. A method for determining an output current of a converter, measuring signals corresponding to an output current and detected by a sensor being supplied to a respective processing channel, within which a method as recited in claim 1 is implemented.

18. A method for determining an output current of a converter, measuring signals corresponding to an output current and detected by a sensor being supplied to a respective processing channel, within which a method as recited in claim 5 is implemented.

* * * * *